United States Patent
Dickie

(10) Patent No.: US 9,608,664 B2
(45) Date of Patent: Mar. 28, 2017

(54) COMPRESSION OF INTEGER DATA USING A COMMON DIVISOR

(71) Applicant: International Business Machines Corporation, Armonk, NY (US)

(72) Inventor: Garth A. Dickie, Framingham, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 14/143,770

(22) Filed: Dec. 30, 2013

(65) Prior Publication Data
US 2015/0188563 A1    Jul. 2, 2015

(51) Int. Cl.
*H03M 7/30* (2006.01)

(52) U.S. Cl.
CPC .......... *H03M 7/30* (2013.01); *H03M 7/6005* (2013.01)

(58) Field of Classification Search
None
See application file for complete search history.

(56) References Cited

U.S. PATENT DOCUMENTS

| | | | |
|---|---|---|---|
| 5,467,087 A | 11/1995 | Chu | |
| 5,603,022 A | 2/1997 | Ng et al. | |
| 5,729,228 A | 3/1998 | Franaszek | |
| 5,964,842 A | 10/1999 | Packard | |
| 6,195,024 B1 | 2/2001 | Fallon | |
| 6,253,222 B1 | 6/2001 | Dyer | |
| 6,373,986 B1 * | 4/2002 | Fink | G06T 9/00 382/232 |
| 6,396,420 B1 | 5/2002 | Augustine | |
| 6,462,680 B1 * | 10/2002 | Hayes | H03M 7/30 341/50 |
| 6,577,254 B2 | 6/2003 | Rasmussen | |
| 6,624,761 B2 | 9/2003 | Fallon | |
| 6,885,319 B2 | 4/2005 | Geiger | |
| 7,024,414 B2 | 4/2006 | Sah et al. | |

(Continued)

FOREIGN PATENT DOCUMENTS

| | | |
|---|---|---|
| CN | 101711001 A | 5/2010 |
| EP | 2387004 | 11/2011 |

(Continued)

OTHER PUBLICATIONS

Wolfram MathWorld, "Fundamental Theorem of Arithmetic", 2012, retrieved from https://web.archive.org/web/20120704180459/http://mathworld.wolfram.com/FundamentalTheoremofArithmetic.html.*

(Continued)

*Primary Examiner* — Matthew Sandifer
(74) *Attorney, Agent, or Firm* — Mohammed Kashef; Edell, Shapiro & Finnan, LLC

(57) ABSTRACT

According to one embodiment of the present invention, a system for compressing data determines a common divisor for a set of values comprising integers. The system divides each value within the set of values by the common divisor to produce reduced values, and represents the set of values in the form of data indicating the common divisor and the reduced values. Embodiments of the present invention further include a method and computer program product for compressing data in substantially the same manners described above.

13 Claims, 8 Drawing Sheets

(56) References Cited

U.S. PATENT DOCUMENTS

| | | | |
|---|---|---|---|
| 7,139,765 B1 | 11/2006 | Balkany et al. | |
| 7,453,377 B2 | 11/2008 | Lee et al. | |
| 7,529,752 B2 | 5/2009 | Hinshaw et al. | |
| 7,612,694 B1* | 11/2009 | Schneider | H03M 7/30 341/50 |
| 7,652,596 B1* | 1/2010 | Sharma | H03M 7/40 341/106 |
| 7,991,811 B2 | 8/2011 | Carlson | |
| 8,108,355 B2 | 1/2012 | Zhang | |
| 8,108,361 B2* | 1/2012 | Netz | G06F 17/30501 380/28 |
| 8,126,855 B2 | 2/2012 | Faerber et al. | |
| 8,719,322 B2 | 5/2014 | Bishop | |
| 9,350,384 B2 | 5/2016 | Ackerman et al. | |
| 9,356,621 B2 | 5/2016 | Ackerman et al. | |
| 9,450,603 B2 | 9/2016 | Dickie | |
| 2001/0031092 A1 | 10/2001 | Zeck | |
| 2001/0051941 A1 | 12/2001 | Tonomura | |
| 2002/0090141 A1 | 7/2002 | Kenyon et al. | |
| 2007/0257824 A1* | 11/2007 | Harada | G10L 19/035 341/51 |
| 2008/0071818 A1* | 3/2008 | Apanowicz | G06F 17/30463 |
| 2008/0189251 A1 | 8/2008 | Branscome et al. | |
| 2008/0270496 A1 | 10/2008 | Lundvall | |
| 2009/0210467 A1 | 8/2009 | Iorio | |
| 2010/0153064 A1 | 6/2010 | Cormode et al. | |
| 2010/0281079 A1 | 11/2010 | Marwah et al. | |
| 2011/0099295 A1* | 4/2011 | Wegener | H03M 7/46 709/247 |
| 2011/0145308 A1 | 6/2011 | Duale | |
| 2012/0016901 A1 | 1/2012 | Agarwal et al. | |
| 2012/0054225 A1 | 3/2012 | Marwah et al. | |
| 2012/0089579 A1 | 4/2012 | Ranade et al. | |
| 2013/0018889 A1 | 1/2013 | Jagmohan et al. | |
| 2013/0086353 A1 | 4/2013 | Colgrove et al. | |
| 2013/0099946 A1 | 4/2013 | Dickie et al. | |
| 2013/0124467 A1 | 5/2013 | Naidu et al. | |
| 2015/0188564 A1 | 7/2015 | Dickie | |
| 2015/0286465 A1 | 10/2015 | Dickie | |
| 2015/0288381 A1 | 10/2015 | Dickie | |
| 2016/0094242 A1 | 3/2016 | Ackerman et al. | |
| 2016/0094243 A1 | 3/2016 | Ackerman et al. | |
| 2016/0098420 A1 | 4/2016 | Dickie et al. | |
| 2016/0098439 A1 | 4/2016 | Dickie et al. | |
| 2016/0154831 A1 | 6/2016 | Dickie | |
| 2016/0154835 A1 | 6/2016 | Dickie | |
| 2016/0196278 A1 | 7/2016 | Ackerman et al. | |
| 2016/0197622 A1 | 7/2016 | Ackerman et al. | |
| 2016/0204797 A1 | 7/2016 | Ackerman et al. | |
| 2016/0204798 A1 | 7/2016 | Ackerman et al. | |
| 2016/0204799 A1 | 7/2016 | Ackerman et al. | |
| 2016/0226512 A1 | 8/2016 | Dickie | |
| 2016/0246810 A1 | 8/2016 | Ackerman et al. | |
| 2016/0246811 A1 | 8/2016 | Ackerman et al. | |

FOREIGN PATENT DOCUMENTS

| | | |
|---|---|---|
| KR | 1020110053737 A | 5/2011 |
| WO | 2008034213 A1 | 3/2008 |
| WO | 2009058650 | 5/2009 |
| WO | 2013096620 | 6/2013 |

OTHER PUBLICATIONS

Wikipedia.org, "Fundamental theorem of arithmetic", 2013, retrieved from https://en.wikipedia.org/w/index.php?title=Fundamental_theorem_of_arithmetic&oldid=574451066.*

Baek, Seung Jun, et al; "Minimizing energy consumption in large-scale sensor networks through distributed data compression and hierarchical aggregation." Selected Areas in Communications, IEEE Journal on 22, No. 6 (2004): 1130-1140.

Yang, Dow-Yung, et al; "Compression of particle data from hierarchical approximate methods." ACM Transactions on Mathematical Software (TOMS) 27, No. 3 (2001): 317-339.

Wikepedia, "Charles Joseph Minard", Sep. 22, 2014, 4 pages.

Friedman, "Data Visualization: Modern Approaches", Smashing Magazine, Aug. 2, 2007, 29 pages.

Wiegand, "Google Analytics Flow Analysis—Early Insights", Analytics Review, Jan. 15, 2013, 6 pages.

IBM, "Information as service from Server Explorer in Microsoft Visual Studio .Net", IP.com, IPCOM000139374D, Aug. 22, 2006, 5 pages.

Raman et al., "DB2 with BLU Acceleration: So Much More than Just a Column Store", VLDB Endowment, vol. 6, No. 11, Copyright 2013, VLDB Endowment 2150-8097/13/09, 12 pages.

Justin Zobel and Alistair Moffat, "Inverted Files for Text Search Engines". ACM Computing Surveys, vol. 38, No. 2, Article 6 (Jul. 2006). DOI=10.1145/1132956.1132959 http://doi.acm.org/10.1145/1132956.1132959.

Jordi Nin, Anne Laurent, and Pascal Poncelet, "Speed up gradual rule mining from stream data! A B-Tree and OWA-based approach". J. Intell. Inf. Syst. 35, 3 (Dec. 2010), pp. 447-463. DOI=10.1007/s10844-009-0112-9 http://dx.doi.org/10.1007/s10844-009-0112-9.

J. M. Chambers, "Algorithm 410: Partial Sorting [M1]", CACM, vol. 14, Issue 5, May 1971, pp. 357-358.

William Pugh, "A Skip List Cookbook", UMIACS-TR-89-72.1, Jul. 1989, pp. 2-14.

Internet Society et al.; "A Negative Acknowledgment Mechanism for Signaling Compression"; An IP.com Prior Art Database Technical Disclosure; http://ip.com/IPCOM/000125196D; May 24, 2005.

Tagliasacchi, M. et al.; "Transform coder identification based on quantization footprints and lattice theory"; Department of Electronics and Information, Milano College, Milano Italy; Nov. 19, 2012.

Euclid, "Elements," Books 7 and 10, c. 300 BC; http://aleph0.clarku.edu/~djoyce/java/elements/toc.html.

Microsoft, "Block-Based Floating Point Texture Compression", An IP.com Prior Art Database Technical Disclosure http://ip.com/IPCOM/000167464D, Feb. 14, 2008. 9 pages.

IBM, "Practical Two-Cycle Forwarding Mechanism for Floating Point Units", An IP.com Prior Art Database Technical Disclosure, http://ip.com/IPCOM/000116162D, IBM Technical Disclosure Bulletin, vol. 38, No. 08, Aug. 1995, pp. 225-236.

Pool et al., "Lossless Compression of Variable-Precision Floating-Point Buffers on GPUs", ACM, copyright 2011, pp. 1-8.

Isenburg et al., "Lossless Compression of Floating-Point Geometry", copyright Cad Solutions Co., Ltd., CAD'04 Conference, 2004, pp. 1-7.

Steele Jr. et al., "How to Print Floating-Point Nos. Accurately", Proceedings of the ACM SIGPLAN'90 Conference, White Plains, NY, Jun. 1990, ACM 0-89791-364-7/90/000610112, pp. 112-126.

Loitsch, Florian, "Printing Floating-Point Nos. Quickly and Accurately with Integers", PLDI'10, Toronto, Ontario, Canada, Jun. 2010, ACM 978-1-4503-0019/10/06, 11 pages.

Isenburg et al., "Lossless Compression of Predicted Floating-Point Values", http://www.cs.unc.edu/~isenburg/cpfpv/, accessed May 2013, 2 pages.

Isenburg et al., "Lossless Compression of Predicted Floating-Point Geometry", Jul. 10, 2004, pp. 1-13.

Lindstrom et al., "Fast and Efficient Compression of Floating-Point Data", IEEE Transactions on Visualization and computer Graphics, vol. 12, No. 5, Sep./Oct. 2006, 6 pages.

"Capture and display of performance profile for dataflow graph", IPCOM000232481D, Nov. 11, 2013, 4 pages.

* cited by examiner

COMPRESSION OF INTEGER DATA USING A COMMON DIVISOR

BACKGROUND

1. Technical Field

Present invention embodiments relate to data compression, and more specifically, to compressing a set of integers by identifying a common divisor.

2. Discussion of the Related Art

Query performance in a data warehouse is often limited by the time spent reading data from persistent storage devices. To reduce the amount of data that must be read, the data may be stored in compressed forms. In a columnar compression scheme (whether the final arrangement of the compressed data is columnar or not), values from a single column may be grouped together and compressed separately from values of other columns. Existing compression techniques for columns of integer data represent values (or differences between values) in a reduced number of bits if the values are small—effectively trimming off high-order bits that are runs of all-one or all-zero. However, existing techniques do not efficiently trim off runs of low-order bits or exploit other patterns in integer data.

BRIEF SUMMARY

According to one embodiment of the present invention, a system for compressing data determines a common divisor for a set of values comprising integers. The system divides each value within the set of values by the common divisor to produce reduced values, and represents the set of values in the form of data indicating the common divisor and the reduced values. Embodiments of the present invention further include a method and computer program product for compressing data in substantially the same manners described above.

BRIEF DESCRIPTION OF THE SEVERAL VIEWS OF THE DRAWINGS

Generally, like reference numerals in the various figures are utilized to designate like components.

DETAILED DESCRIPTION

Present invention embodiments relate to compression of a set of integers by identifying a common divisor. According to one embodiment, a stream of integer data from a source to a destination is compressed by computing the greatest common divisor of the values, or of differences between the values. The data is represented in compressed form by factoring out this common factor. The common factor may be transmitted to the destination first, followed by the quantities with the common factor removed.

One aspect of a present invention embodiment is to compress data (e.g., timestamp data, sensor data, or the like) in which patterns containing many zero low-order bits, and more generally a common integer factor in the differences between values, tend to occur. Timestamps, for instance, may be represented in a database as integers with microsecond granularity, but the data may have been produced with less precision. For example, the source data may only have millisecond, second, minute, or hour granularity. This results in data with a common factor of 1000, 1000000, 60000000, or 3600000000.

Another aspect of a present invention embodiment is to facilitate decompression by requiring a limited amount of state information and enabling efficient implementation of decompression operations in hardware.

Figure 1:
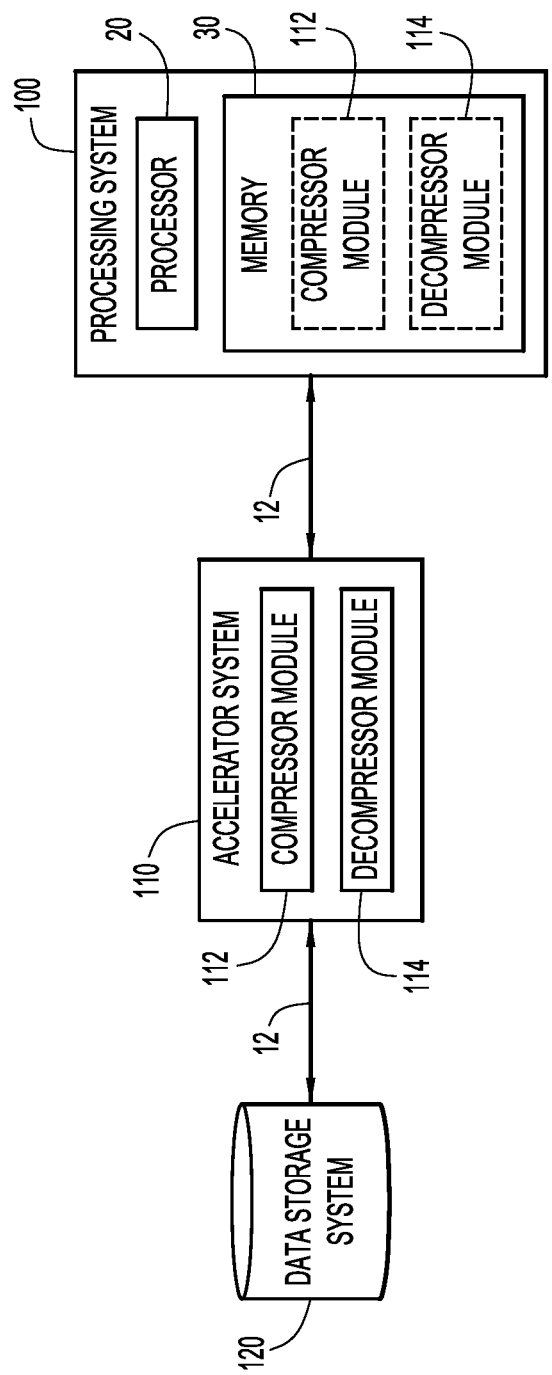
FIG. 1 is a diagrammatic illustration of an example environment for an embodiment of the present invention.

An example environment for present invention embodiments is illustrated in FIG. 1. Specifically, the environment includes data processing system 100, accelerator system 110, and data storage system 120. Processing system 100, accelerator system 110, and data storage system 120 may communicate directly or indirectly with one another and (optionally) other computing systems (e.g., database server systems, client or end-user systems, etc.) via one or more data channels 12. Data (e.g., integer data values for a column of a table in a database, or other groups of data) may be received by the accelerator system (e.g., from processing system 100). The acceleration system compresses the data, and writes the compressed data to data storage system 120. Furthermore, the accelerator system may read compressed data from data storage 120 (e.g., in response to a request from processing system 100), decompress the data, and provide the decompressed data to processing system 100.

Processing system 100 may be implemented by any conventional or other computer systems and may include at least one processor 20, memory 30, internal or external network interface or communications devices (e.g., modem, network cards, etc.), optional input devices (e.g., a keyboard, mouse, or other input device), monitor or display, and any commercially available and custom software (e.g., compressor module software, decompressor module software, query processing software, data analysis software, etc.).

Data storage system 120 may be implemented by any conventional or other data storage unit(s) (e.g., database, file, repository, hard disk, cache, etc.), and contains data representing integer values in a compressed form.

Accelerator system 110 may include compressor module 112 to perform data compression and decompressor module 114 to perform data decompression. Alternatively, any combination of compressor module 112 and decompressor module 114 may reside on processing system 100 and/or other computing system in communication with processing system 100 or data storage system 120. In one embodiment, accelerator system 110 is implemented as a Field Programmable Gate Array (FPGA). However, the accelerator system may be implemented by any combination of one or more general-purpose processors and other systems (e.g., application specific integrated circuits (ASICs), components on a printed circuit board, etc.), or may be absent.

The processing system, acceleration system, compression module, and decompression module may include one or more modules or units to perform the various functions of present invention embodiments described below (e.g., computing common greatest common divisors, factorizing integers, multiplying by powers of factors, etc.) or other functions (e.g., selecting data in response to a query, performing additional compression/decompression, etc.), may be implemented by any combination of any quantity of software and/or hardware modules or units, and may reside within memory 30 of a processing system and/or other computing system for execution by a processor 20.

Figure 2:
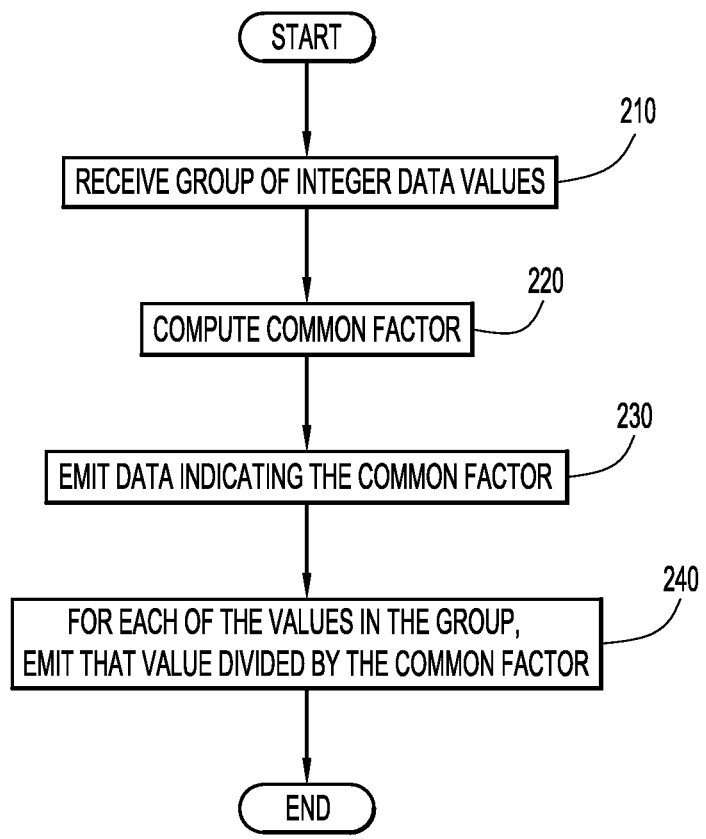
FIG. 2 is a flow diagram illustrating an example manner of compressing integer data values according to an embodiment of the present invention.

An example manner of compressing integer data values (e.g., via accelerator system 110 or processor 20 of processing system 100) according to an embodiment of the present invention is illustrated in FIG. 2. Initially, at step 210, compressor module 112 receives a group of integer data values (e.g., values (or a subset of the values) for a column of a table in a database, differences between values and a baseline, a first value of a sequence and differences between successive values in the sequence, or any other group of integer values).

At step 220, the compressor module computes a common factor of the received values. In one embodiment, the common factor is the greatest common divisor (GCD) of the values. For a pair of integers a and b, the greatest common divisor GCD(a, b) may be computed using, e.g., Euclid's algorithm. The GCD of three or more integers may be computed, e.g., by repeated application of the algorithm for determining the GCD of a pair of integers. For example, GCD(GCD(a, b), c) is the GCD of three integers a, b, and c. For a group of n integers $x_1, x_2, \ldots x_n$, the compressor module may compute the GCD in the following example manner: initially, compute $g=GCD(x_1, x_2)$; then, for each i from 3 to n, compute $GCD(g, x_i)$ and replace g with the result. The final value of g is the GCD of the group of integers.

In another embodiment, bounds may be imposed on the common factor. For example, the decompressor module may only have the ability (or may have an optimized ability) to multiply by integer values of a limited size (e.g., 16, 18, 32, or 36 bits wide). In this case the compressor module may limit the common factor to fit within the number of bits accommodated by the decompressor module. If the GCD is too large to fit within that many bits, the compressor module may search for a smaller common factor (e.g., by looking for prime factors in general, or looking for factors which are powers of 2, 3, 5, . . . up to a limited set of primes). The compressor module may look for smaller common factors of the group of integers by looking for factors of the GCD. Alternatively, if the common factor (e.g., the GCD) is larger than a predetermined bound, the compressor module may abandon the attempt to identify a common factor and proceed without reducing the received values.

Still another embodiment may support only common factors of the form $2^{a_2} \times 3^{a_3} \times 5^{a_5} \times \ldots$ for a limited set of primes. In addition, upper bounds may be imposed on the exponents (e.g., $a_2, a_3, a_5$, etc.). The compression module may compute the exponents by, for example, counting the number of times the GCD may be divided with zero remainder by each of the primes in the set. Supporting only multiplication by powers of a predetermined, limited set of prime or non-prime numbers (e.g., 2 and 5; 2, 3, and 5; 6 and 10; or the like) allows for multipliers in a hardware decompressor that are simpler and easier to pipeline than multiplication by more general common factors.

At step 230, the compressor module emits data indicating the common factor. For example, the compressor module may write the common factor (e.g., in binary, as a string of text, etc.) to data storage system 120. In an embodiment that limits the common factor to a limited set of primes, the compressor module may emit exponents (e.g., $a_2, a_3, a_5$, etc.) so that the common factor is $2^{a_2} \times 3^{a_3} \times 5^{a_5} \times \ldots$ (for whatever set of prime powers are supported).

At step 240, for each of the values in the group, the compressor module emits the result of dividing that value by the common factor. These results are referred to as reduced values. In addition, the compressor may emit other information before, with, or after the common factor and/or reduced values (to indicate, e.g., that compression using a common factor and/or other techniques has been applied, a baseline value subtracted from each value, that the reduced values represent differences with respect to a first value, the number of values, that the common factor is represented by a exponents of a particular set of primes, etc.). The compressor (or other module(s)) may partition the group of integer data values received in step 210 (based on, e.g., the order in which the values are received, the magnitude of the values, information associated with the values, random assignment, etc.), and perform steps 220-240 separately for separate partitions (e.g., using a different common factor for each partition).

Figure 3:
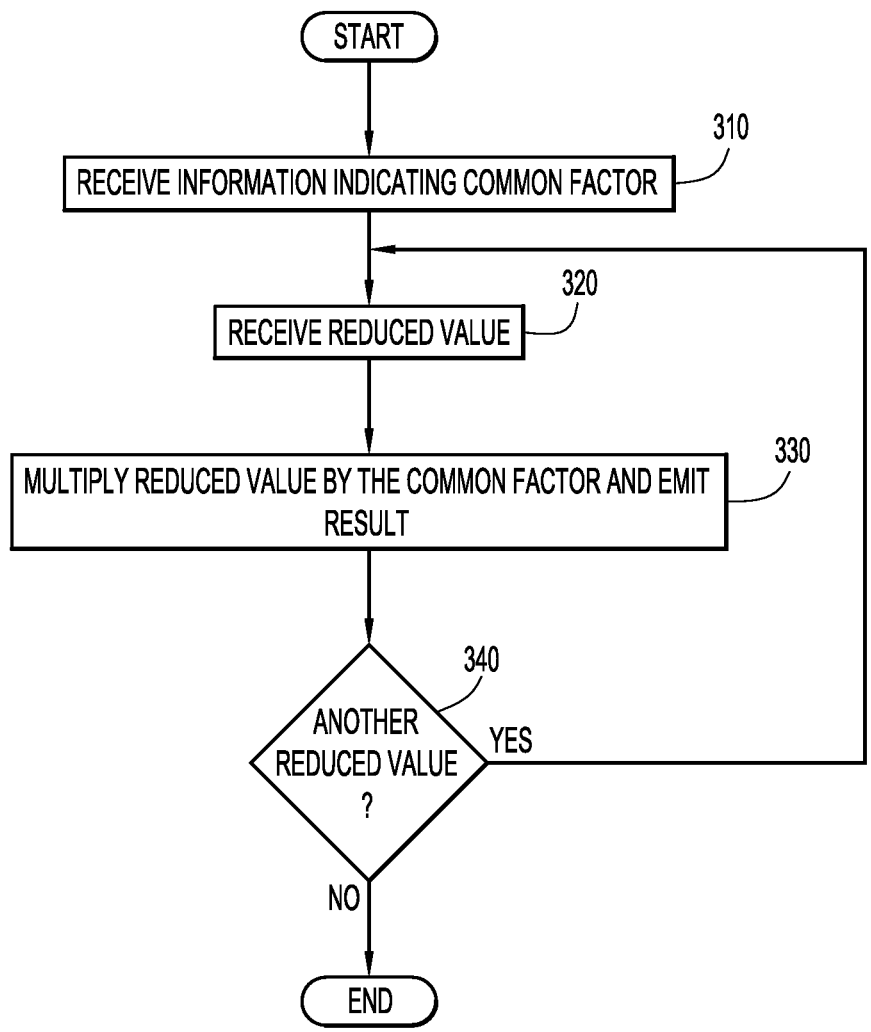
FIG. 3 is a flow diagram illustrating an example manner of decompressing integer data values according to an embodiment of the present invention.

An example manner of decompressing integer data values according to an embodiment of the present invention (e.g., via accelerator system 110 or processor 20 of processing system 100) is illustrated in FIG. 3. Initially, decompressor module 114 receives information indicating the common factor at step 310. At step 320, the decompressor receives a reduced value. At step 330, the decompressor multiplies the reduced value by the common factor and emits the result. At step 340, the decompressor determines whether another reduced value remains to be processed. If so, processing returns to step 320. Otherwise processing ends. In addition, the decompressor may perform other processing. For example, the decompressor may add or remove header information, add a baseline value, add a preceding value of a sequence to a difference, apply other decompression techniques, and the like. The decompressor may multiply reduced values by the common factor and send the result (e.g., to memory 30 of processing system 100) individually or as a block of values.

Figure 4:
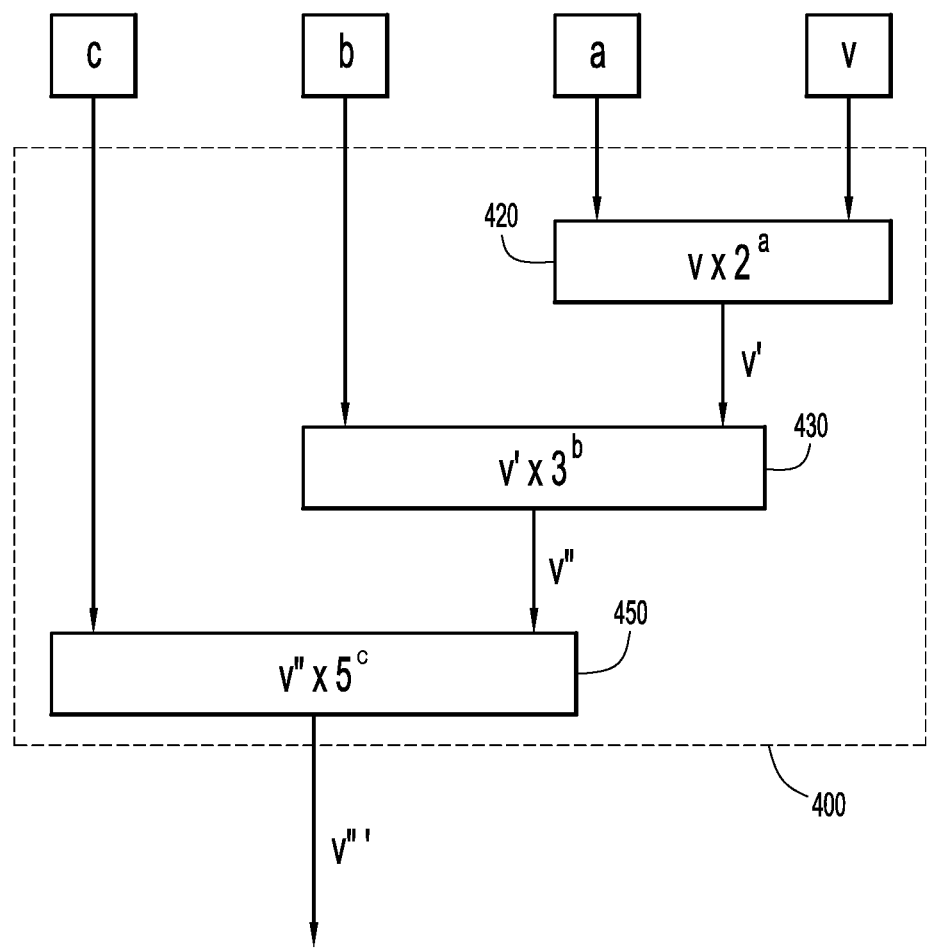
FIG. 4 is a block diagram of an example circuit for multiplying an integer data value by a product of powers of a limited set of primes for a hardware decompressor according to an embodiment of the present invention.

Using a common factor that may be expressed as a product of powers of a predetermined, limited set of primes may facilitate use of a hardware decompressor. By way of illustration, a block diagram of an example unit 400 for multiplying an integer data value v by a common factor equal to a product of powers of two, three, and five—with exponents a, b, and c, respectively—for use in a hardware decompressor module according to an embodiment of the present invention is shown in FIG. 4. In particular, unit 400 receives input values v, a, b, and c and produces as output the value $v'''=v \times 2^a 3^b 5^c$. Unit 400 includes units 420, 430, and 450. Unit 420 receives v and a as input and produces as output the value $v'=v \times 2^a$. Unit 430 receives v' and b as input and produces as output the value $v''=v' \times 3^b$. Unit 450 receives v'' and c as input and produces as output the result $v'''=v'' \times 5^c$.

Figure 5:
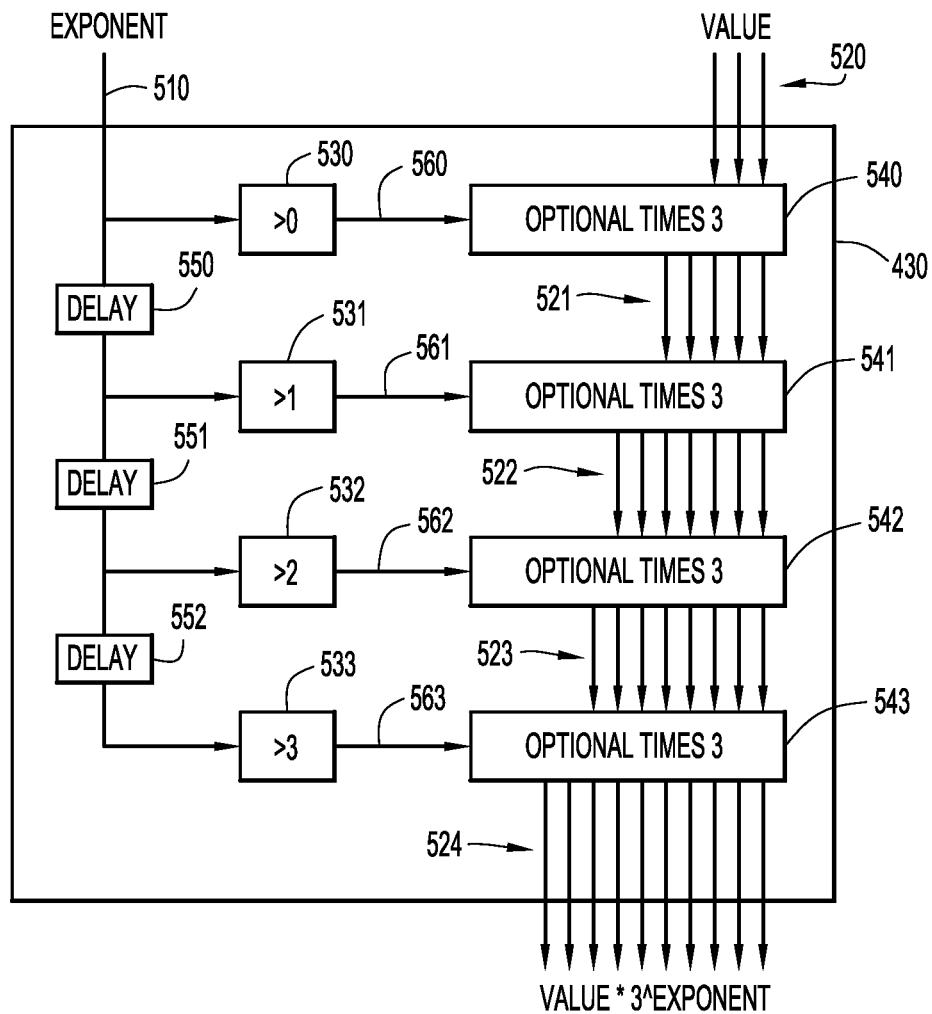
FIG. 5 is a block diagram of an example unit 430 of FIG. 4, for multiplying an integer data value by a power of three according to an embodiment of the present invention.

A block diagram of an example unit 430 for multiplying a value by a power of three according to an embodiment of the present invention is illustrated in FIG. 5. Unit 430 receives an exponent 510 (e.g., b) and a group of bits 520 representing an input value (e.g., v'), and produces an output represented by a group of bits 524. Unit 430 includes comparison units 530, 531, 532, and 533; optional-times-three units 540, 541, 542, and 543; and delay units 550, 551, and 552. Each comparison unit receives the exponent, compares the exponent to a threshold, and produces either an output signal denoted T indicating that the input is above the threshold or an output signal denoted F indicating that the input is not above the threshold. Each optional-times-three unit receives a control signal from the output of a comparison unit, receives a group of bits representing an input value, and produces a value represented by group of output bits. If the control signal for an optional-times-three unit is T, the output of the unit represents three times the input value, otherwise the output is equal to the input. Each delay unit holds the exponent for a period of time to synchronize operation of a corresponding comparison unit and optional-times-three unit. The comparison units and delay units may be implemented by any conventional or other techniques.

In particular, input exponent 510 is sent to comparison unit 530 and delay unit 550. Comparison unit 530 compares the exponent to zero and sends control signal 560 indicating the result of the comparison to optional-times-three unit 540. Optional-times-three unit 540 receives bits 520 and produces bits 521 based on control signal 560. Similarly, the exponent is sent from delay unit 550 to comparison unit 531 and delay unit 551. Comparison unit 531 compares the exponent to one and sends control signal 561 indicating the result of the comparison to optional-times-three unit 541. Optional-times-three unit 541 receives bits 521 and produces bits 522 based on control signal 561. Likewise, the exponent is sent from delay unit 551 to comparison unit 532 and delay unit 552. Comparison unit 532 compares the exponent to two and sends control signal 562 indicating the result of the comparison to optional-times-three unit 542. Optional-times-three unit 542 receives bits 522 and produces bits 523 based on control signal 562. The exponent is sent from delay unit 552 to comparison unit 533. Comparison unit 533 compares the exponent to three and sends control signal 563 indicating the result of the comparison to optional-times-three unit 543. Optional-times-three unit 543 receives bits 523 and produces bits 524 based on control signal 563.

The example unit 430 illustrated in FIG. 5 supports multiplication of an input value by three raised to a power up to four, where the input value is represented by three bits. However, the maximum exponent may have any value (e.g., more or fewer delay, comparison unit, optional-times-three unit combinations may be used), and the input value may be represented using any number of input bits. The number of output bits of each optional-times-three or similar unit may be a minimum number of bits for representing the output (e.g., for a group of three input bits 520, optional-times-three unit 542 may have output bits 523 that are only one bit wider than its input bits 522).

Figure 6:
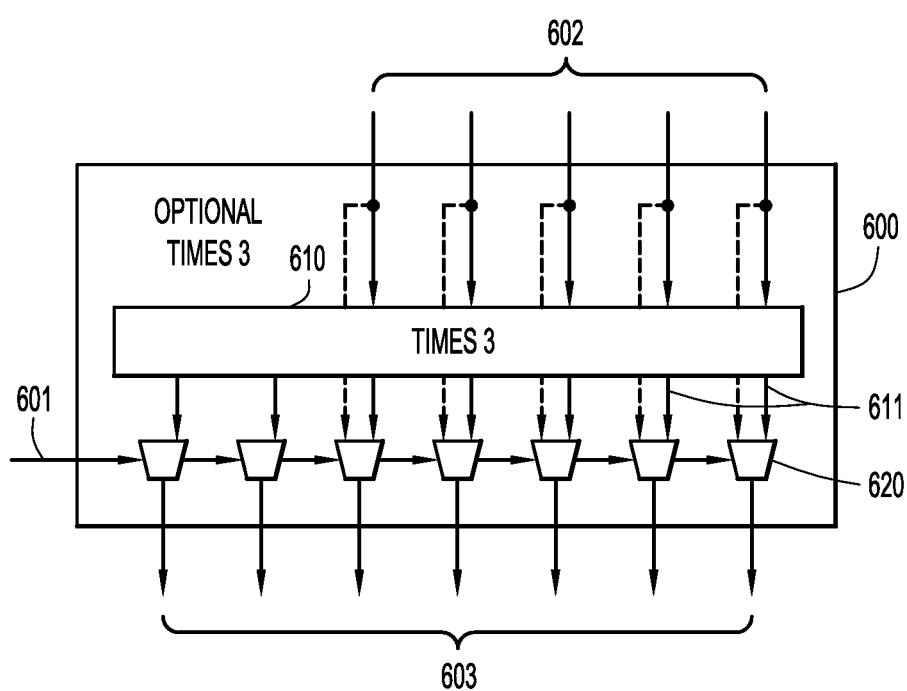
FIG. 6 is a block diagram of an example unit for an optional-times-three unit of FIG. 5 according to an embodiment of the present invention.

A block diagram of an example optional-times-three unit 600 (e.g., an optional-times-three unit 540-543) according to an embodiment of the present invention is illustrated in FIG. 6. The optional-times-three unit receives a control signal 601 (e.g., control signals 560-563) and a group of n input bits 602 (e.g., bits 520-523), produces a group of m output bits 603 (e.g., bits 521-524), and includes times-three unit 610 and m selector units 620. Times-three unit 610 receives input bits 602, representing an input value, and produces m intermediate bits 611, representing three times the input value. Each of the m selector units 620 receives a corresponding intermediate bit 611 as a first input. The selector units receiving the n lowest order intermediate bits 611 receive corresponding input bits 602 as a second input. The remaining selector units receive zero as a second input. Each selector receives control signal 601 and produces an output bit 603 equal to the first (second) input bit if control signal 601 is T (F). As a result, output bits 603 represent the same value as input bits 602 if control signal 601 is F, and represent three times that value if the control signal is T. Selector units 620 may be implemented by any conventional or other devices (e.g., multiplexers, logic, etc.).

Figure 7:
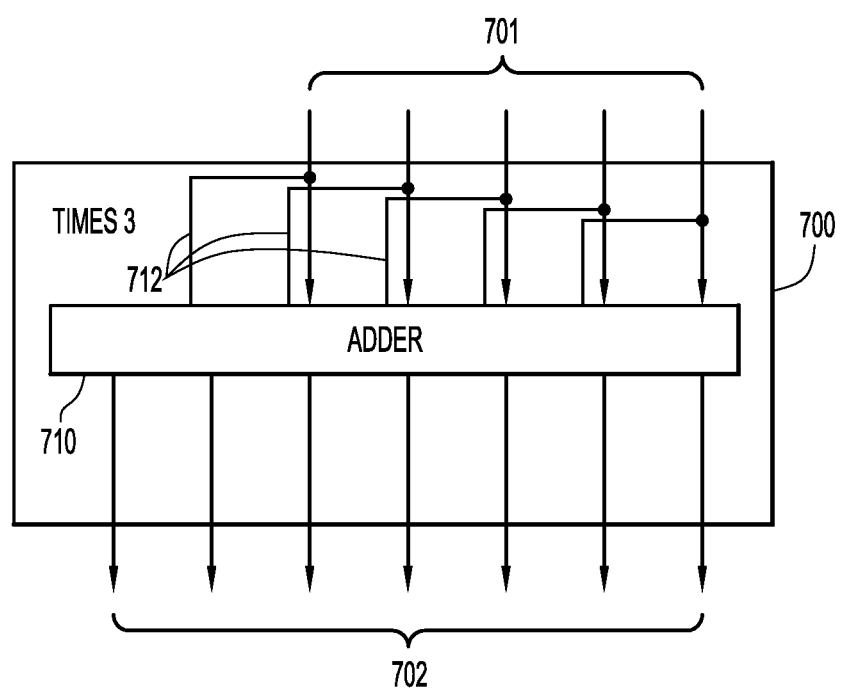
FIG. 7 is a block diagram of an example times-three unit of FIG. 6 according to an embodiment of the present invention.

A block diagram of an example times-three unit 700 (e.g., times-three unit 610) according to an embodiment of the present invention is illustrated in FIG. 7. Times-three unit 700 receives input bits 701 (e.g., input bits 602) representing an input value v and produces output bits 702 (e.g., intermediate bits 611) representing three times the input value v. Times-three unit 700 includes adder unit 710, which receives input bits 701 and a second group of bits 712 representing a second value, and produces output bits 702 (e.g., output bits 603) representing the sum of the input value and the second value. Adder unit 710 may be implemented by any conventional or other techniques. Input bits 712 may be formed by splitting and left-shifting input bits 701 by one. For example, the path for each input bit 701 may be connected to a corresponding site of adder unit 710 for the first input and connected to the site of adder unit 710 for the next higher order bit for the second input. In other words, times-three unit 700 may compute $3 \times v$ by computing $v + 2 \times v$, where $2 \times v$ is obtained by a bit-shift.

Unit 420 for multiplying a value by a power of two, unit 450 for multiplying a value by a power of five, and, in general, units for multiplying a value by a number x raised to a power may be implemented in a similar manner as unit 430 using units for multiplying by x (times-x units) in place of times-three units. A times-two unit may be implemented using a hardware shift.

Figure 8:
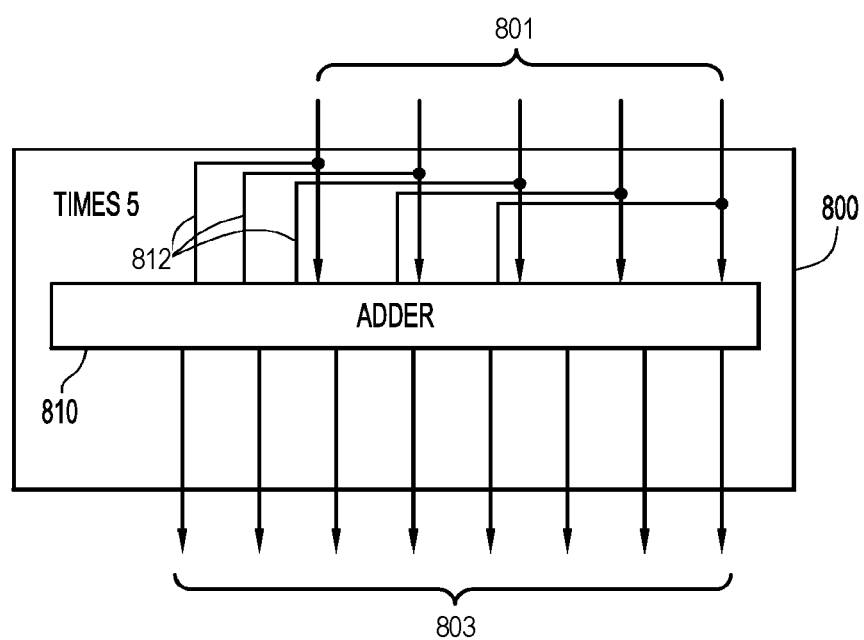
FIG. 8 is a block diagram of an example times-five unit according to an embodiment of the present invention.

A block diagram of an example times-five unit 800 according to an embodiment of the present invention is illustrated in FIG. 8. Times-five unit 800 receives input bits 801 representing an input value v and produces output bits 802 representing five times the input value v. Times-five unit 800 includes adder unit 810, which receives input bits 801 and a second group of bits 812 representing a second value, and produces output bits 803 representing the sum of the input value and the second value. Adder unit 810 may be implemented by any conventional or other techniques. Input bits 812 may be formed by splitting and left-shifting input bits 801 by two. For example, the path for each input bit 801 may be connected to a corresponding site of adder unit 810 for the first input and connected to the site of adder unit 810 for the next-to-next higher order bit for the second input. In other words, times-five unit 800 may compute $5 \times v$ by computing $v + 4 \times v$, where $4 \times v$ is obtained using a hardware shift.

It will be appreciated that the embodiments described above and illustrated in the drawings represent only a few of the many ways of implementing embodiments for compressing and decompressing integer data values by identifying a common factor.

A common factor can be a product of any powers of any set of primes, and a hardware decompressor may support multiplication by any powers of any finite set of numbers. For example, times-x units for other values of x, and, accordingly, other units for multiplying by powers of x, may be implemented in a similar manner to times-two, times-three, and times-five units.

The environment of the present invention embodiments may include any number of computer or other processing systems (e.g., client or end-user systems, server systems, accelerator systems, etc.) and storage systems (e.g., file systems, databases, or other repositories), arranged in any desired fashion, where the present invention embodiments may be applied to any desired type of computing environment (e.g., cloud computing, client-server, network computing, mainframe, stand-alone systems, etc.). The computer or other processing systems employed by the present invention embodiments may be implemented by any number of any personal or other type of computer or processing system (e.g., desktop, laptop, PDA, mobile devices, etc.), and may include any commercially available operating system and any combination of commercially available and custom software (e.g., database software, communications software, etc.). These systems may include any types of monitors and input devices (e.g., keyboard, mouse, voice recognition, touch screen, etc.) to enter and/or view information.

The various functions of the computer, accelerator, or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, intranet, Internet, hardwire, modem connection, wireless, etc.). For example, the functions of the present invention embodiments may be distributed in any manner among various server systems, end-user/client and/or any other intermediary processing devices including third party client/server processing devices. The software and/or algorithms described above and illustrated in the flow charts may be modified in any manner that accomplishes the functions described herein. In addition, the functions in the flow charts or description may be performed in any order that accomplishes a desired operation.

Any combination of processing system 100, accelerator system 110, data storage system 120, and/or other computer systems (e.g., database host systems, client or end user systems, etc.) may communicate locally or over a network implemented by any number of any types of communications network (e.g., LAN, WAN, Internet, intranet, VPN, etc.). The computer or other processing systems of the present invention embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, Intranet, etc.).

The system may employ any number of data storage systems and structures to store information. The data storage systems may be implemented by any number of any conventional or other databases, file systems, caches, repositories, warehouses, etc.

The present invention embodiments may employ any number of any type of user interface (e.g., Graphical User Interface (GUI), command-line, prompt, etc.) for obtaining or providing information, where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, touch screen, pen, etc.).

It is to be understood that software and/or hardware (e.g., compressor module 112, decompressor module 114, unit 400, etc.) of the present invention embodiments could be developed by one of ordinary skill in the computer arts based on the functional descriptions contained in the specification and flow charts and block diagrams illustrated in the drawings. Further, any references herein of software performing various functions generally refer to computer systems or processors performing those functions under software control. The computer systems of the present invention embodiments may alternatively be implemented by any type of hardware and/or other processing circuitry.

The present invention embodiments are not limited to the specific tasks, algorithms, parameters, data, or network/environment described above, but may be utilized for compressing and decompressing integer data of any kind of integer data values (e.g., sensor data, timestamps, counts, indices, encoded symbols, etc.) of any size (e.g., 32-bit, 8-bit, 64-bit, unlimited, etc.) represented in any format (e.g., binary, string, etc.). Reduced values and common factor may stored, read, transmitted, or received in any order (e.g., common factor followed by reduced values, reduced values followed by common factor, etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A system for compressing a plurality of integer data values to produce reduced values and for decompressing the reduced values to reproduce the plurality of integer data values, the system comprising:
 a compressor configured to:
  receive the plurality of integer data values,
  determine a common divisor for the received plurality of data integer values,
  divide each integer data value within the plurality of integer data values by the common divisor to produce reduced values, and
  compress the plurality of integer data values by representing the plurality of integer data values in a form of data indicating the common divisor and the reduced values, the common divisor being a product of powers of a predetermined set of numbers and data indicating the common divisor includes exponents for the predetermined set of numbers; and a hardware decompressor configured to receive a reduced value and the exponents for the predetermined set of numbers and to decompress the reduced value, the hardware decompressor comprising:
  a plurality of hardware units, each of the plurality of hardware units being configured to receive a respective value and a respective exponent and produce an output representing a product of the respective value and a respective number of the predetermined set of numbers raised to a power indicated by the respective exponent, each of the plurality of hardware units including a plurality of times circuits implementing a left hardware shift, wherein:
  a first hardware unit is configured to receive the reduced value and a first exponent and produce an output representing a product of the reduced value and a first number of the predetermined set of numbers raised to a power indicated by the first exponent,
  a second hardware unit is configured to receive the output of the first hardware unit and a second exponent and produce an output representing a product of the output of the first unit and a second number of the predetermined set of numbers raised to a power indicated by the second exponent, and
  a third hardware unit is configured to receive the output of the second hardware unit and a third exponent and produce an output representing a product of the output of the second unit and a third number of the predetermined set of numbers raised to a power indicated by the third exponent.

2. The system of claim 1, wherein the compressor being configured to determine a common divisor for the received plurality of integer data values further comprises the compressor being configured to determine a greatest common divisor of the plurality of integer data values.

3. The system of claim 1, wherein the compressor being configured to determine the common divisor for the received plurality of integer data values further comprises the compressor being configured to:
  determine a greatest common divisor for the plurality of integer data values;
  compare the greatest common divisor to a threshold; and
  determine a new common divisor with a lesser value in response to the greatest common divisor exceeding the threshold.

4. The system of claim 1, wherein:
  each of the plurality of times circuits receives a respective control signal and a respective value and produces either the respective value or a product of the respective value and a respective number of the predefined set of numbers,
  a first times circuit of the plurality of times circuits of a hardware unit receives the reduced value and a respective control signal and produces an output being either the reduced value or a product of the reduced value and the respective number of the predetermined set of numbers, the output being based on the respective control signal, and
  each respective times circuit, excluding the first times circuit, receives a respective control signal and an output of an immediately preceding times circuit and produces an output equivalent to either an output of the immediately preceding times circuit or a product of the output of the immediately preceding times circuit and the respective number of the predetermined set of numbers, the output of the each respective times circuit being based on the respective control signal.

5. The system of claim 4, wherein each of the plurality of times circuits includes an adder and performs at least one hardware bit-shift.

6. A computer program product for compressing and decompressing data, the computer program product comprising:
  a non-transitory computer readable storage medium having computer readable program code embodied therewith for execution on a processing system, the computer readable program code comprising computer readable program code configured to be executed by the processing system to cause the processing system to:
  receive a plurality of integer data values;
  determine a common divisor for the plurality of integer data values;
  divide each integer data value within the plurality of integer data values by the common divisor to produce reduced values;
  compress the plurality of integer data values by representing the plurality of integer data values in a form of data indicating the common divisor and the reduced values;
  store the form of data indicating the reduced values and the common divisor in a data storage system;
  obtain data indicating a second common divisor and second reduced values from a second form of data stored in the data storage system, the second common divisor being a product of powers of a predetermined set of numbers and the data indicating the second common divisor including exponents for the predetermined set of numbers;
  provide a second reduced value and the exponents to a hardware decompressor including a plurality of hardware units, each of the plurality of hardware units being configured to receive a respective value and a respective exponent and produce an output representing a product of the respective value and a respective number of the predetermined set of numbers raised to a power indicated by the respective exponent, each of the plurality of hardware units including a plurality of times circuits implementing a left hardware shift, wherein:
  a first hardware unit is configured to receive the second reduced value and a first exponent and produce an output representing a product of the second reduced value and a first number of the predetermined set of numbers raised to a power indicated by the first exponent, and
  each successive hardware unit, excluding the first hardware unit, is configured to receive a respective exponent and an output of an immediately preceding hardware unit and output a product of the output of the immediately preceding unit and a next number of the predetermined set of numbers raised to a power indicated by the respective exponent.

7. The computer program product of claim 6, wherein the processing system being caused to determine a common divisor for the received plurality of data integer values further comprises the processing system being caused to determine a common divisor that is a greatest common divisor of the plurality of integer data values.

8. The computer program product of claim 6, wherein the processing system being configured to determine a common divisor further comprises the processing system being configured to:
   determine a greatest common divisor for the plurality of integer data values;
   compare the greatest common divisor to a threshold; and
   determine a new common divisor with a lesser value in response to the greatest common divisor exceeding the threshold.

9. A device for decompressing compressed data, the compressed data including data indicating a common divisor and a plurality of reduced values, the reduced values having been reduced by dividing a plurality of integer data values by the common divisor, the data indicating the common divisor includes exponents for a predetermined set of numbers, the device comprising:
   a plurality of hardware units, each of the plurality of hardware units being configured to receive a respective value and a respective exponent and produce an output representing a product of the respective value and a respective number of the predetermined set of numbers raised to a power indicated by the respective exponent, each of the plurality of hardware units including a plurality of times circuits implementing a left hardware shift, wherein:
   a first hardware unit is configured to receive a first reduced value and a first exponent and produce an output representing a product of the first reduced value and a first number of the predetermined set of numbers raised to a power indicated by the first exponent, and
   each successive hardware unit, excluding the first hardware unit, is configured to receive a respective exponent and an output of an immediately preceding hardware unit and output a product of the output of the immediately preceding hardware unit and a next number of the predetermined set of numbers raised to a power indicated by the respective exponent.

10. The device of claim 9, wherein the predetermined set of numbers is a set of prime numbers.

11. The device of claim 9, wherein:
   each of the plurality of times circuits is configured to receive a respective input value and a respective control signal based on a value of the respective exponent,
   a first times circuit is configured to receive a first respective value and a first control signal and, based on the first control signal, produce an output that represents either the first respective value or a product of the first respective value and a number of the predetermined set of numbers, and
   each successive times circuit is configured to receive an output of a preceding times circuit and a respective control signal and, based on the respective control signal, produce an output representing either a value of the output of the preceding times circuit or a product of the value of the output of the preceding times circuit and the number of the predetermined set of numbers.

12. The device of claim 11, wherein:
   each respective hardware unit includes a respective comparison unit associated with each corresponding times circuit included in the respective hardware unit, the respective comparison unit is configured to receive the respective exponent and produce the respective control signal based on comparing the respective exponent to a respective threshold value, the respective control signal produced by the comparison unit indicates a result of comparing the respective exponent with the respective threshold value.

13. The device of claim 11, wherein:
   each of the plurality of times circuits includes an adder that is configured to add the respective input value to the respective input value left shifted by at least one bit.

* * * * *